United States Patent [19]

Fritz

[11] 4,438,847
[45] Mar. 27, 1984

[54] FILM CARRIER FOR AN ELECTRICAL CONDUCTIVE PATTERN

[75] Inventor: Otmar Fritz, Neukeferloh, Fed. Rep. of Germany

[73] Assignee: Siemens Aktiengesellschaft, Berlin and Munich, Fed. Rep. of Germany

[21] Appl. No.: 471,311

[22] Filed: Mar. 2, 1983

[30] Foreign Application Priority Data

Mar. 2, 1982 [DE] Fed. Rep. of Germany ....... 3207450

[51] Int. Cl.³ .................. B65D 85/30; B65D 73/02; H05K 5/00
[52] U.S. Cl. .................................. 206/330; 206/820
[58] Field of Search ............... 206/330, 321, 331, 820

[56] References Cited

U.S. PATENT DOCUMENTS

| | | | |
|---|---|---|---|
| 3,278,018 | 10/1966 | Ishler et al. | 206/331 |
| 3,440,027 | 4/1969 | Hugle | 206/330 |
| 3,465,874 | 9/1969 | Hugle et al. | 206/330 |
| 3,517,438 | 6/1970 | Johnson et al. | 206/330 |
| 3,550,766 | 12/1970 | Nixen | 206/328 |
| 3,659,821 | 5/1972 | Sakamoto et al. | 206/330 |
| 3,695,414 | 10/1972 | Wiesler et al. | 206/328 |
| 3,858,721 | 1/1975 | Boyer et al. | 206/330 |

*Primary Examiner*—William T. Dixson, Jr.
*Attorney, Agent, or Firm*—Hill, Van Santen, Steadman & Simpson

[57] ABSTRACT

This invention provides for increased precision position adjustment for carrier film supported micro-packs in which the carrier film has applied thereto a conductive pattern producing a contact array emminating from a function unit such as a microchip carried by the carrier film. Precise adjustment of the conductive pattern relative to the terminals of the function unit is provided for by arranging the carrier film as a film having the width of, for example, standard cinema film (35 mm), but however using the marginal film transport perforations of a miniature film (8 mm) and in addition providing two adjustment openings per contact array which have larger dimensions equivalent to the transport dimensions of the cinema film.

8 Claims, 1 Drawing Figure

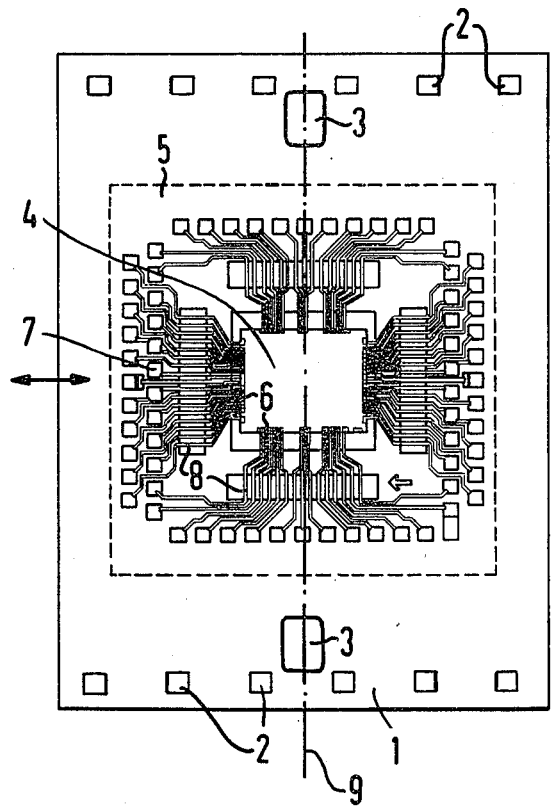

FILM CARRIER FOR AN ELECTRICAL CONDUCTIVE PATTERN

BACKGROUND OF THE INVENTION

1. Field of the Invention

This invention relates to a carrier film for micropacks having the width of a cinema film for each electrical conductive pattern carried thereby.

2. Prior Art.

It is known in the manufacture of miniature electronic components to construct integrated modules consisting of a functional unit, for example, an integrated circuit or a resistor network, and for a contact array or electrically conducted pattern operatively connected to the outer terminals of the functional unit, the unit and contact array defining an integrated module. It is also known to create such integrated modules utilizing a carrier film wherein the film is an electrically insulated carrier having a conductive pattern consisting of etched tracks applied thereto. The carrier can be fabricated as a film carrier for the purpose of providing a great plurality of conductive patterns spaced along the length of the film. A functional unit which is contacted with the conductive pattern on a film carrier is sometimes referred to as a micro-pack. The manufacturer of micro-packs requires precision adjustment of the carrier film relative to the terminals of the integrated circuit or other function unit, particularly when circuits having a great plurality of terminals are utilized.

It is known to utilize as the carrier film standard film having the width of a cinema film, for example, 35 mm. Such carrier films can be specifically constructed with edge perforations of the type normally utilized in the manufacturing format of miniature films. Miniature films, for example, of the type having a width of 8 mm, can be manufactured from wider film cut in to correspondingly narrow strips.

However, for the purpose of precise adjustment in the manufacture of the microfilm, such normal perforation openings or transport holes are not sufficiently suitable for use as sole reference points for position adjustment. The primary reason lies in the small dimensions of the transport openings which requires correspondingly precision designed tools for adjustment. This requirement for small transport openings coupled with precision designed tools can provide misassembly particularly where the perforation openings are damaged before assembly of the micro-pack, for example, due to transport occurrences or during the assembly process. The damage can then lead to an inprecision in the assembly. Uniform high precision is required for proper assembly, particularly in those instances where automatic assembly is utilized.

It has also been known to utilize a carrier film having larger marginal perforations of the type normally employed by cinema films. In such instances, the marginal perforations are larger than the marginal perforations utilized with miniature films. The disadvantage of use of such larger perforations is that a considerable part of the film will therefore be occupied by the marginal perforation tracks and will therefore not be available for carrying the conductive pattern. This is particularly important where conductive arrays having a large number of lines, for example, from 64 to 240 lines, are used. In such instances, maintenance of as large as possible a percentage of the surface for exploitation by the conductive pattern array is preferred.

SUMMARY OF THE INVENTION

It is therefore a principal object of this invention to provide a carrier film of the above type that insures high adjustment precision in the assembly of a micropack while maintaining useability of a large portion of the surface area of the carrier film.

This object is achieved in that the carrier film which is a wide gauge film utilizing edge perforations which correspond to the marginal perforations normally utilized in the manufacturing format of narrow gauge films, but that the carrier film includes at least two adjustment openings positioned opposite one another which are dimensioned according to the size of transport perforations normally used in cinema films with the adjustment openings positioned relative to the edges of the carrier film in substantially the same as positioning of the transport holes of a cinema film.

In a further refinement of this invention, the adjustment openings are disposed centrally relative to two openings of the marginal perforations. Advantageously, the adjustment openings are also positioned centrally relative to a structural center line of the conductive array.

This has a principal advantage in that the surface available on the carrier film which can be occupied by the conductive array is not significantly restricted. Moreover, as an additional benefit, those film carriers which utilize perforations according to standard cinema film marginal perforation specifications will have a conductive array which is centrally positioned relative to the perforations in a manner to provide identical points of reference to the inventive carrier film. When the same dimensions are present in the contacting array of the micro-pack, then the assembly of the micro-pack can ensue with the same tools and devices presently utilized. For example, the inventive carrier film can be utilized in standard processing with only an interchange of the supply roles given a rolled roll processing technique. As a result of the central positioning of the adjustment openings between two openings of the marginal transport perforations, and centrally relative to the conductive array, the adjustment opening becomes independent of the length of the micro-pack, with length being determined in the conveying direction of the carrier film.

Other objects, features and advantages of the invention will be readily apparent from the following description of a preferred embodiment thereof, taken in conjunction with the accompanying drawings, although variations and modifications may be effected without departing from the spirit and scope of the novel concepts of the disclosure, and in which:

BRIEF DESCRIPTION OF THE DRAWING

The FIGURE illustrates a carrier film according to this invention provided with a contact array and an integrated circuit.

DESCRIPTION OF THE PREFERRED EMBODIMENTS

The FIGURE shows a carrier film which is preferably constructed of an electrically insulating material. The carrier film 1 is provided with an etched conductive pattern or array 5 and with a function unit 4. The function unit 4 can, for example, consist of an integrated circuit or of a resistive network. The conductive array 5 includes a plurality of lines over which the function unit 4 is to be connected to the outer leads of the integrated module. The connection of the individual lines or tracks 8 to the function unit 4 occurs at an inside contacting area 6. Connection of the tracks 8 to the terminals of the integrated module or device utilizing the micro-pack ensues over the outer boundary of the contact array as at 7.

The film carrier 1 can be provided with a large number of conductive patterns 5 or of conductive patterns 5 together with function units 4 in the conveying direction of the carrier film, as indicated by the arrow. It will be appreciated that the FIGURE shows one section or one micro-pack which can be formed along the length of a roll wound carrier film.

As is known in the industry, the carrier film, at right angles to the conveying direction, has the width of a standard cinema film, for example, 35 mm. As is normal with such cinema film, the carrier film is provided with marginal perforations forming traction openings. The edge perforations 2 are, according to this invention, formed, however, of a size standard to smaller gauge films such as 8 mm films, in contradistinction to the large transport perforations normally used with cinema films. For example, in the standard manufacturing format used for such miniature films, the margin perforations along one side edge can have a spacing of 0.787 mm, a side length of 1.143 mm and a corner radius of 0.13 mm. The holes on the other edge can, for example, be positioned 1.27 mm from the edge, have a width of 0.914 mm and a length of 1.143 mm. The distance from one side of the marginal perforation to the corresponding side of the neighboring perforation can amount to 4.234 mm. It will be understood that these dimensions are illustrative only and that standard dimensions used in the film manufacturing industry are well known.

The carrier film 1 is provided with two adjustment openings 3. The adjustment openings 3 are aligned between two of the marginal perforations 2 centrally thereof. The size and positioning of the adjustment holes relative to the edges of the film carrier 1 preferably corresponds to the size and positioning of a standard transport perforation of a cinema film. For example, in connection with 35 mm film, the adjustment openings can have a length of 2.8 mm, width of 1.99 mm, and a corner radius of 0.5 mm. The narrow sides are parallel to the edges of the carrier film 1 with the longer side dimension lying normal to the edge. The adjustment openings 3 are positioned centrally relatively to the structural center line 9 of the array. That is, the structural center line 9 is chosen as a bisector of the conductive array 9 and of the centrally positioned function unit 4 with the center line 9 lying normal to the direction of transport of the film. The adjustment openings 3 are positioned opposite one another relative to the edges of the film carrier.

Additional dimensional data concerning manufacture of the marginal performations according to a standard manufacturing format for miniature film can, for example, be found in German industrial standard DIN 15851. Dimensional data relating to the adjustment openings 3, for example, can be found in ISO standard 491-1978, E, type P.

It will therefore be appreciated that this invention is directed to a carrier film micro-pack where the carrier film exhibits an overall dimension corresponding to a cinema film but where the marginal transport perforations correspond to those established for miniature films and where the carrier film is provided with additional adjustment openings having dimensions and positions which correspond to marginal perforation openings for cinema films, there being at least one set of adjustment openings provided for each micro-pack or for each conductive array area of the carrier film, the adjustment openings being positioned between two of the marginal perforation openings and being aligned along a line which bisects the carrier film normal to the direction of transport and which further, preferably, bisects the conduction array and function unit of the micro-pack.

Although the teachings of my invention have herein been discussed with reference to specific theories and embodiments, it is to be understood that these are by way of illustration only and that others may wish to utilize my invention in different designs or applications.

I claim as my invention:

1. A carrier film for use in the manufacture of electronic micro-packs having contact arrays comprising a film having marginal edge perforations along each edge longitudinal side thereof, the marginal perforations being substantially of the dimension and spacing of transport perforations for narrow gauge film, at least two adjustment openings through the carrier film, the adjustment openings being positioned on opposite sides of the film normal to the transport direction of the film, the adjustment openings being positioned and dimensioned substantially according to position and size standards for cinema film transport perforations, at least one pair of said adjustment openings being provided for each contact array area of the carrier film.

2. A carrier film according to claim 1, wherein the adjustment openings are positioned centrally relative to adjacent marginal perforation openings.

3. Film carrier according to claim 2, wherein the adjustment openings are disposed centrally relative to a structural center line of the conductive array, the center line lying normal to the transport direction of the film.

4. A carrier film for production of electronic micropacks, comprising a film strip having marginal perforations along each longitudinal side edge of the film strip, the marginal perforations being dimensioned and spaced substantially according to standards for narrow gauge films, a plurality of contact array areas along the longitudinal length of said strip, at least one pair of adjustment openings for each contact array area, one of the adjustment openings of each pair lying adjacent each of the longitudinal edges of said film on opposite sides of the contact array area, said adjustment openings dimensioned and positioned on said film strip substantially in accordance with standard dimensions and positions of marginal transport perforations for wide gauge cinema film.

5. A carrier film according to claim 4, wherein substantially the entirety of the adjustment openings are positioned inwardly towards the longitudinal center of the film strip from the marginal perforations.

6. A film strip according to claim 5, wherein the adjustment openings are bisectable by a line which passes equal distant between adjacent marginal perforations.

7. A film strip according to claim 6, wherein the bisecting line passes centrally of the contact array of each micro-pack.

8. A carrier film for electronic micro-packs having marginal perforations dimensioned substantially according to standard marginal perforations 8 mm films, the carrier film having a width substantially equal to 35 mm cinema film, the carrier film divided into a plurality of individual contact array areas, each contact array area having a pair of adjustment perforations with one perforation lying on each side of the contact array adjacent the longitudinal sides of the carrier film, the adjustment openings dimensioned substantially equal to dimensions for standard marginal transport perforations for 35 mm cinema film, the adjustment openings lying substantially on a line normal to the transport direction of the carrier film which passes equal distance between adjacent marginal perforations.

* * * * *